(12) United States Patent
Chan et al.

(10) Patent No.: US 8,273,606 B2
(45) Date of Patent: Sep. 25, 2012

(54) METHOD OF FABRICATING A SEMICONDUCTOR PACKAGE USING A FLUXING UNDERFILL COMPOSITION APPLIED TO SOLDER BALLS IN A DIP PROCESS

(75) Inventors: Chew B. Chan, Chino Hills, CA (US); Qing Ji, Chino Hills, CA (US); Mark Currie, Costa Mesa, CA (US); Neil Poole, Claremont, CA (US); Geraldine Kelly, Hemel Hempstead (GB)

(73) Assignees: Henkel Corporation, Rocky Hill, CT (US); Henkel Ltd, Hertforshire (GB)

( * ) Notice: Subject to any disclaimer, the term of this patent is extended or adjusted under 35 U.S.C. 154(b) by 29 days.

(21) Appl. No.: 12/884,405

(22) Filed: Sep. 17, 2010

(65) Prior Publication Data
US 2011/0065242 A1    Mar. 17, 2011

Related U.S. Application Data

(63) Continuation of application No. PCT/US2009/037491, filed on Mar. 18, 2009.

(60) Provisional application No. 61/037,753, filed on Mar. 19, 2008.

(51) Int. Cl.
*H01L 21/00* (2006.01)
*B05D 1/18* (2006.01)

(52) U.S. Cl. ..................... 438/118; 427/430.1

(58) Field of Classification Search .................. 438/118; 427/430.1
See application file for complete search history.

(56) References Cited

U.S. PATENT DOCUMENTS

| 5,514,729 | A  * | 5/1996 | Diamant et al. | 522/81 |
| 6,241,385 | B1   | 6/2001 | Hof | |
| 6,395,124 | B1 * | 5/2002 | Oxman et al. | 156/275.5 |
| 7,022,410 | B2 * | 4/2006 | Tonapi et al. | 428/414 |
| 7,279,359 | B2 * | 10/2007 | Chen et al. | 438/108 |
| 2007/0178244 | A1 * | 8/2007 | Torii et al. | 427/430.1 |

FOREIGN PATENT DOCUMENTS

| GB | 1017612 | 1/1966 |
| GB | 1024288 | 3/1966 |
| JP | 2003-082064 A | 3/2003 |
| JP | 2003-128874 A | 5/2003 |
| JP | 2006-160852 A | 6/2006 |
| WO | WO 2009/013210 | 1/2009 |

OTHER PUBLICATIONS

International Search Report issued in connection with International Patent Application No. PCT/US2009/037491 mailed Sep. 29, 2009.

* cited by examiner

*Primary Examiner* — William D Coleman
(74) *Attorney, Agent, or Firm* — Steven C. Bauman

(57) ABSTRACT

The present invention relates to a method of fabricating a semiconductor package or circuit assembly using an fluxing underfill composition applied to solder contact points in a dip process.

10 Claims, No Drawings

METHOD OF FABRICATING A SEMICONDUCTOR PACKAGE USING A FLUXING UNDERFILL COMPOSITION APPLIED TO SOLDER BALLS IN A DIP PROCESS

BACKGROUND OF THE INVENTION

1. Field of the Invention

The present invention relates to a method of fabricating a semiconductor package or circuit assembly using a fluxing underfill composition applied to solder contact points in a dip process.

2. Brief Description of Related Technology

A semiconductor device assembly of a semiconductor chip joined to a substrate by solder joints may use an underfill sealant material to fill a space between the semiconductor chip and the substrate to help absorb stresses and shock.

Conventional methods of applying the underfill sealant material include capillary flow underfill materials, no-flow underfill materials and wafer applied underfill materials.

To date, there has not been an underfill sealant material applied as a dip process, let alone one having fluxing capabilities. Until now.

SUMMARY OF THE INVENTION

The present invention provides in one aspect a method of fabricating a semiconductor package, whose steps include:

a. dispensing into a container a curable composition to serve as a fluxing underfill composition;

b. adjusting the height of the curable composition within the container;

c. providing a semiconductor chip to which is attached one or more solder contact point(s) and disposing the chip in relation to the container such that at least a portion of the solder contact point(s) penetrate the curable composition so as to provide a coating on that portion of the solder contact point(s) that penetrates the curable composition;

d. placing onto a circuit board or a carrier substrate in a spaced apart relationship the semiconductor chip to which is attached one or more solder contact point(s) having a coating of curable composition thereon to define a gap therebetween and create a semiconductor package assembly; and e. subjecting the semiconductor package assembly to conditions sufficient to reflow the one or more solder contact point(s) within the gap and to cure the curable composition where the one or more solder contact point(s) meet the circuit board or the carrier substrate within the gap.

In an optional step, dispensing into the container an additional amount of the curable composition and/or adjusting the height of the curable composition within the container, is contemplated so as to ensure a proper amount of curable composition exists for coating the one or more solder contact point(s).

The present invention provides in another aspect a method of providing fluxing and underfill through the use of one composition, whose steps include:

a. providing a semiconductor chip to which is attached one or more solder contact point(s);

b. dispensing a fluxing underfill composition onto at least a portion of the solder contact point(s) to form a coating thereon;

c. placing onto a circuit board or a carrier substrate the semiconductor chip to which is attached one or more solder contact point(s) having a coating of fluxing underfill composition thereon to establish an electrical interconnection therebetween and to form an assembly; and d. exposing the assembly to elevated temperature conditions sufficient to cure the fluxing underfill composition.

Thus, by these methods, a semiconductor device (such as a semiconductor chip to which is attached one or more solder contact point(s)) is placed onto a carrier substrate or circuit board and when the device travels through reflow, the fluxing underfill composition provides the action necessary to form a solder joint and the thermosetting resin of the fluxing underfill composition encapsulates the solder spheres, delivering added support and protection. Because these methods allow for both solder joint formation and sphere encapsulation, greater process optimization may be realized. The equipment and time required for traditional capillary flow underfilling can be eliminated and throughput can be dramatically enhanced.

DETAILED DESCRIPTION OF THE INVENTION

Thus, as noted above, the present invention provides in one aspect a method of fabricating a semiconductor package, whose steps include:

a. dispensing into a container a curable composition to serve as a fluxing underfill composition;

b. adjusting the height of the curable composition within the container;

c. providing a semiconductor chip to which is attached one or more solder contact point(s) and disposing the chip in relation to the container such that at least a portion of the solder contact point(s) penetrate the curable composition so as to provide a coating on that portion of the solder contact point(s) that penetrates the curable composition (desirably the solder contact point(s) should receive a coating of the composition of between 25% and 80% of its diameter or height);

d. placing onto a circuit board or a carrier substrate in a spaced apart relationship the semiconductor chip to which is attached one or more solder contact point(s) having a coating of curable composition thereon to define a gap therebetween and create a semiconductor package assembly; and e. subjecting the semiconductor package assembly to conditions sufficient to reflow the one or more solder contact point(s) within the gap and to cure the curable composition where the one or more solder contact point(s) meet the circuit board or the carrier substrate within the gap.

In an optional step, dispensing into the container an additional amount of the curable composition and/or adjusting the height of the curable composition within the container, is contemplated so as to ensure a proper amount of curable composition exists for coating the one or more solder contact point(s). By solder contact points is meant solder pads, solder balls, solder spheres or other solder electrical interconnects.

The present invention provides in another aspect a method of providing fluxing and underfill through the use of one composition, whose steps include:

a. providing a semiconductor chip to which is attached one or more solder contact point(s);

b. dispensing a fluxing underfill composition onto at least a portion of the solder contact point(s) to form a coating thereon;

c. placing onto a circuit board or a carrier substrate the semiconductor chip to which is attached one or more solder contact point(s) having a coating of fluxing underfill composition thereon to establish an electrical interconnection therebetween and to form an assembly; and d. exposing the assembly to elevated temperature conditions sufficient to cure the fluxing underfill composition.

The present invention provides in another aspect a method of fabricating a circuit assembly, comprising the steps of:

a. dispensing into a container a curable composition to serve as a fluxing underfill composition;

b. adjusting the height of the curable composition within the container;

c. providing a semiconductor package to which is attached one or more solder contact point(s) and disposing the package in relation to the container such that at least a portion of the solder contact point(s) penetrate the curable composition so as to provide a coating on that portion of the solder contact point(s) that penetrates the curable composition;

d. placing onto a circuit board or a carrier substrate in a spaced apart relationship the semiconductor package to which is attached one or more solder contact point(s) having a coating of curable composition thereon to define a gap therebetween and create a circuit assembly; and e. subjecting the circuit assembly to conditions sufficient to reflow the one or more solder contact point(s) within the gap and to cure the curable composition wherein the one or more solder contact point(s) meet the circuit board or the carrier substrate within the gap; and f. optionally, dispensing into the container an additional amount of the curable composition and/or adjusting the height of the curable composition within the container.

The thermosetting resin of the present invention may include for instance any common epoxy resin, though the epoxy resin should include the combination of aromatic epoxy resins and aliphatic epoxy resins.

Suitable epoxy resin(s) include generally, but are not limited to, polyglycidyl ethers of polyvalent phenols, for example pyrocatechol; resorcinol; hydroquinone; 4,4'-dihydroxydiphenyl methane; 4,4'-dihydroxy-3,3'-dimethyldiphenyl methane; 4,4'-dihydroxydiphenyl dimethyl methane; 4,4'-dihydroxydiphenyl methyl methane; 4,4'-dihydroxydiphenyl cyclohexane; 4,4'-dihydroxy-3,3'-dimethyldiphenyl propane; 4,4'-dihydroxydiphenyl sulfone; tris(4-hydroxyphenyl)methane; polyglycidyl ethers of the chlorination and bromination products of the above-mentioned diphenols; polyglycidyl ethers of novolacs (i.e., reaction products of monohydric or polyhydric phenols with aldehydes, formaldehyde in particular, in the presence of acid catalyst; polyglycidyl ethers of diphenols obtained by esterifying 2 moles of the ethers of diphenols obtained by esterifying 2 moles of the sodium salt of an aromatic hydrocarboxylic acid with 1 mole of a dihaloalkane or dihalogen dialkyl ether (see U.K. Pat. No. 1,017,612, the disclosure of which is hereby expressly incorporated herein by reference); and polyglycidyl ethers of polyphenols obtained by condensing phenols and long-chain halogen paraffins containing at least two halogen atoms (see U.K. Pat. No. 1,024,288, the disclosure of which is hereby expressly incorporated herein by reference).

Other suitable epoxy compounds include polyepoxy compounds based on aromatic amines and epichlorohydrin, such as N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

Particularly desirable examples of the multifunctional epoxy resin include bisphenol A-type epoxy resin, bisphenol F-type epoxy resin, phenol novolac-type epoxy resin, and cresol novolac-type epoxy resin.

Among the epoxy resins suitable for use herein are polyglycidyl derivatives of phenolic compounds, such as those available commercially under the tradenames EPON 828, EPON 1001, EPON 1009, and EPON 1031, from Resolution Performance Co.; DER 331, DER 332, DER 334, and DER 542 from Dow Chemical Co.; RE-310-S, RE-404-S and BREN-S from Nippon Kayaku, Japan. Other suitable epoxy resins include polyepoxides prepared from polyols and the like and polyglycidyl derivatives of phenol-formaldehyde novolacs, the latter of which are available commercially under the tradenames DEN 431, DEN 438, and DEN 439 from Dow Chemical Co. Cresol analogs are also available commercially ECN 1235, ECN 1273, and ECN 1299 from Vantico, Inc. SU-8 is a bisphenol A-type epoxy novolac available from Interez, Inc. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE MY-721, ARALDITE MY-722, ARALDITE 0500, and ARALDITE 0510 from Vantico and PGA-X and PGA-C from the Sherwin-Williams Co.

Aliphatic epoxy resins include alicyclic and cycloaliphatic epoxy resins, commercially available examples of which include Dow's ERL 4221 and Daicel's Celoxide 2021.

Desirably, an epoxy resin includes the combination of bisphenol F epoxy resin and a cycloaliphatic epoxy resin.

The fluxing underfill compositions also include an acidic fluxing component in addition to the epoxy resin component. The acidic fluxing component should include dicarboxylic acids, desirably at least two carboxylic acids, at least one of which is a dicarboxylic acid. For instance, glutaric acid and monocyclic $C_{21}$ dicarboxylic acid are appropriate choices to be used in combination.

The acidic fluxing component should be present in an amount of up to 40% by weight in total based on the total composition, or 5-18% by weight to 20-40% by weight, respectively, of glutaric acid and monocyclic $C_{21}$ dicarboxylic acid.

The acidic fluxing component initially acts to provide flux to the one or more solder contact point(s) and then acts to cure the thermosetting resin.

The compositions also include a catalyst such as zinc based one, like zinc octoate, zinc phosphate, zinc naphthenate, or zinc neodecanoate, or bismuth based ones like bismuth carboxylates.

The catalysts should be used in an amount within the range of 0.5 to 3% by weight.

Reactive diluents may also be used, commercially available examples of which may be obtained from CVC Chemicals including o-cresyl glycidyl ether (GE-10), p-t-butyl phenyl glycidyl ether (GE-11), neopentyl glycol di-glycidyl ether (GE-20), 1,4-butanediol di-glycidyl ether (GE-21), and cyclohexanedimethanol glycidyl ether (GE-22). Other reactive diluents available commercially from CVC include castor oil tri-glycidyl ether (GE-35) and propoxylated glycerin tri-glycidyl ether (GE-36). Desirably, the compositions are substantially solvent or non-reactive diluent free, which is significant in that virtually no volatile organic compounds evaporate during processing. The rheology at room temperature of the composition thus should be between 1000 to 6000 cps. Such evaporation can influence rheology and also expose end users to hazardous volatile chemicals. However, for certain processing applications, such as jetting or spraying, the viscosity of the composition may be decreased through the addition of solvent.

Flux activators may be included in the compositions. Flux activators added to conventional no flow underfills tend to prematurely cure the epoxy component in the underfills.

Here, the flux activators do not adversely impact the stability of the compositions. Examples of these flux activators include triphenylphosphine oxide, imidazoles and trans-2,3-dibromo-2-butene-1,4-diol, ordinarily useful in amounts less than 500 ppm.

In addition, a dye or color-imparting component may be included in the composition for optical inspection. See International Patent Publication No. WO 2009/013210. More specifically, a color-imparting component with an appropriate color to facilitate optical detection of flux on a component to which the flux is applied. The color-imparting component can be of any suitable type and includes dyes or colorants. The color may be due to fluorescent properties of the material. One criterion is that the given color-imparting agent exhibits an appropriate degree of solubility in the composition. Suitable color-imparting components such as dyes can be chosen from azo, diazo, triarylmethane, xanthene, sulphonephthalein, acrdine, quinoline, azine, oxazine, anthraquinone and indigold dyes as described for instance in U.S. Pat. No. 6,241,385.

Desirably, in a detection process utilizing a red light source the color-imparting agent will comprise a blue, green or purple dye, more desirably a blue dye. Such materials may be selected from Orasol Navy Blue™, Janus Green™, Methyl violet, Patent Blue, Victoria Blue R™, Crystal violet, Irgalith Blue TNC™, Irgalith Magenta TCB™, Erythrosin Extra Bluish™, chlorophenol blue, bromophenol blue, Savinyl Blue B™, Orasol Blue BLN™, Rhoduline violet, pinacyanol chloride, pinacyanol bromide, pinacyanol iodide, Solophenyl Brilliant Blue BL™, Nile Blue A™, Gallocyanin™, Gallamine Blue™, Celestine blue, Methylene blue, Thinonin Toluidine Blue O, Methylene Green and Azure A/B/C™, Savinyl Green B™, Savinyl Blue RS, D+C Green 6™, Blue VIF Organol™, Celliton Blue Extra™, Alizarin Blue S™, Nitro Fast Green GSB, Chinalizarin, Oil Blue N, Solvay Purple™ and combinations thereof as described in U.S. Pat. No. 6,241,385.

Desirably, in a detection process utilizing a red light source the color-imparting agent will comprise a blue, green or purple dye which may be selected from one or more compounds based on anthraquinone. Significantly, the appropriate selection of this component facilitates flux inspection by optical means. This is achieved through synergistic interaction with the illuminating light source in automated pick and place equipment such that the flux appears black. For example, if the illuminating light source is red, then a blue color-imparting component is favored. A component with inadequate flux for reliable soldering can be rejected. Alternatively, if the illuminating light source is ultraviolet (UV) in nature, an appropriate fluorescing color-imparting component which is a fluorescing component may be utilized in an analogous fashion. Provided that the fluorescing color-imparting agent exhibits an appropriate degree of solubility in said flux medium, suitable fluorescent dyes can be chosen, for example from bisbenzoxazolyls, perylenes, anthracenes, indigoids and thioindigoids, imidazoles, naphtalimides, xanthenes, thioxanthenes, coumarins, and rhodamines. Desirably, the fluorescence-imparting agent will be selected from one or more bisbenzoxazolyl-based compounds, such as 2,5-bis(5'-tert-butyl-2-benzoxazolyl) thiophene.

The inventive composition, whether in the form of fluxing underfill or fluxing solder paste, also provides good green strength prior to soldering and, then, a robust soldered joint. In so doing it confers the various properties attributable to a good flux, for example removal of oxide layers from the metal surfaces on the PCB or other substrate, and protecting the clean joint surfaces from oxidation until soldering has taken place. This allows for an improved intermetallic contact.

A semiconductor package may be assembled using the inventive process set forth herein.

For instance, a semiconductor package (such as a CSP/BGA) having solder contact points attached to one surface thereof is immersed into a container of the fluxing underfill composition to an extent to at least partially cover a surface of the solder contact points. The fluxing underfill-coated solder contact point attached surface of the semiconductor package is then aligned and placed over and onto a carrier substrate (e.g. a circuit board) and exposed to solder reflow conditions to generate a semiconductor assembly. For instance, the heat flow (in terms of W/g) begins to increase just below 100° C. and reaches a maximum at about 193° C.

By so doing, the solder contact points are activated by the fluxing underfill composition itself and self alignment of the semiconductor package can occur during the reflow process. Significantly, no post-reflow adhesive process is required. This is a significant time, labor and cost savings to the process, which should improve throughput.

The circuit boards may be constructed from ceramic substrates of $Al_2O_3$, $SiN_3$ and mullite ($Al_2O_3$—$SiO_2$); substrates or tapes of heat-resistant resins, such as polyimides; glass-reinforced epoxy or benzoxazine; ABS and phenolic substrates which are also used commonly as circuit boards; and the like. In order to facilitate connections, the electrodes may be formed as bumps.

The solder contact points may be constructed from a variety of metals, such as Pb, Sn, Ag, Cu, Bi, Ni, Ge, Sb, Zn, Ga, Al, and combinations, mixtures and alloys thereof. For instance, when used, Pb may be present in the alloy in an amount of 30 weight percent to 99 weight percent with the remainder being Sn and/or Ag. Alternatively, for example, when present Ag may be present in the alloy in an amount of 0.5 weight percent to 5 weight percent with the remainder being Sn, Cu, Ni, Ge, Ga, Al and Sb. More specifically, one or more of the following metal mixtures may be useful:

Sn—Pb Series

Sn63-Pb37
Sn10-Pb90
Sn5-Pb95
Sn62-Pb36-Ag2
Sn63-Pb34.5-Ag2-Sb0.5

Sn—Ag—Cu Series

Sn96.5-Ag3.5
Sn—Ag1-Cu0.5
Sn—Ag2.6-Cu0.6
Sn—Ag3-Cu0.5
Sn—Ag3.2-Cu0.5
Sn—Ag3.5-Cu0.75
Sn—Ag3.8-Cu0.7
Sn—Ag4-Cu0.5

Sn—Ag—Cu—Ni—Ge Series

Sn—Ag1-Cu0.5-Ni0.05-Ge
Sn—Ag1.2-Cu0.5-Ni0.02-Ge
Sn—Ag3-Cu0.5-Ni0.05-Ge

CASTIN Series

CASTIN125®
CASTIN258®
CASTIN305®

Sn—Zn Series

Sn91-Zn9
Sn—Zn8-Ag0.5-Al0.01-Ga0.1

Sn—Bi Series

Sn58-Bi42

INNOLOT Series

SnAg3.8Cu0.7Bi3Ni0.15Sb1.4

Fluxing underfill compositions as so described in connection with these methods may also show potential for so-called Package-on-Package ("PoP") processes. In a PoP process, one component is placed on top of another component during the board assembly process. The top surface of the first level component has pads along the perimeter to facilitate attachment of the second level component. A challenge facing PoP assemblers today is the attachment method used for the second level package. Currently, many PoP assemblers use a tacky flux dipping to attach the component. As with fluxing underfill compositions described herein, the component is dipped into a tacky flux prior to placement. When the assembly moves through reflow, the flux activity allows solder joint formation. However, a tacky flux only facilitates solder joint formation; no added device protection is provided. When fluxing underfill compositions are used instead, the interconnect is formed and the solder spheres have an added layer of protection from the encapsulation.

The fluxing underfill compositions may be used in various processing applications. For instance, the compositions may be useful in epoxy flux-contact point attach, where the solder contact points are attached to a laminate package using the composition. The composition may be dispensed in this application by way of jetting/spraying, pin transfer, dipping (as discussed herein), and printing.

The compositions show an improved work life, oftentimes being able to withstand exposure to ambient conditions (e.g. 20-30° C., with 20-70% RH) for periods of up to about at least 24 hours.

The compositions are also reworkable, in that after the package has been assembled post reflow (such as in air, nitrogen, and forming atmospheres), in the event that a defect is found, for instance, the part may be disassembled at the solder contact point and a new part placed in its stead.

It may be desirable to include in some instances solder powder itself in the fluxing underfill composition. In such instances, a fluxing solder paste would be formed. Examples of appropriate solder powders would be those described above. The so formed solder pastes may be used in die attach applications for power packages, for TIM1 applications, and dipping pastes (such as for PoP).

Because the fluxing solder paste includes an epoxy component, improved compatibility with underfill compositions has shown, particularly when the underfill composition also is epoxy containing.

The fluxing underfill compositions described herein useful in connection with the processes also described herein are exemplified by way of components and certain physical properties in more detail below.

EXAMPLES

Sample Nos. 1-2 are set forth below in Table 1.

TABLE 1

| Component | Sample No./Amt. (wt %) 1 | 2 |
|---|---|---|
| Bisphenol F Epoxy | 30 | — |
| Bisphenol A Epoxy | — | 42.7 |
| Cycloaliphatic Epoxy | 20 | 10 |
| Glutaric Acid | 5 | 5 |
| Monocyclic $C_{21}$ Dicarboxylic Acid | 39.5 | 38 |
| Zinc Phosphite Catalyst | 1.5 | 0.80 |
| Gelling Agent | 3 | 3 |
| Epoxy Silane | 0.90 | 0.40 |
| Defoamer | 0.1 | 0.1 |

Certain physical properties of these samples are shown in Table 2.

TABLE 2

| Physical Properties | Sample No. 1 | 2 |
|---|---|---|
| Modulus | 500 | 700 |
| Viscosity (25° C. CP52/20) | 4600 | 6000 |
| CTE α1 (ppm/° C.) | 88 | 60 |
| CTE α2 (ppm/° C.) | 234 | 260 |
| Tg (° C.) by TMA | 30 | 20 |

What is claimed is:

1. A method of fabricating a semiconductor package, comprising the steps of:
   a. dispensing into a container a curable composition comprising in a stoichiometric relationship an epoxy resin component of a combination of bisphenol F epoxy resin and a cycloaliphatic epoxy resin and an acidic fluxing component selected from the group consisting of rosin, a dicarboxylic acid and a combination thereof to serve as a fluxing underfill composition;
   b. adjusting the height of the curable composition within the container;
   c. providing a semiconductor chip to which is attached one or more solder contact point(s) and disposing the chip in relation to the container such that at least a portion of the solder contact point(s) penetrate the curable composition so as to provide a coating on that portion of the solder contact point(s) that penetrates the curable composition;
   d. placing onto a circuit board or a carrier substrate in a spaced apart relationship the semiconductor chip to which is attached one or more solder contact point(s) having a coating of curable composition thereon to define a gap therebetween and create a semiconductor package assembly; and
   e. subjecting the semiconductor package assembly to elevated temperature conditions sufficient to reflow the one or more solder contact point(s) within the gap and to cure the curable composition wherein the one or more solder contact point(s) meet the circuit board or the carrier substrate within the gap; and f. optionally, dispensing into the container an additional amount of the curable composition and/or adjusting the height of the curable composition within the container.

2. The method of claim 1, wherein the curable composition is in one part and has shelf life at room temperature of at least 24 hours.

3. The method of claim 1, wherein the acidic fluxing component initially acts to provide flux to the one or more solder contact point(s) and then acts to cure the epoxy resin component.

4. The method of claim 1, wherein the curable composition has a theology at room temperature of between 1000 to 6000 cps.

5. The method of claim 1, wherein the one or more solder contact point(s) are constructed from a solder alloy that is substantially free of lead.

6. The method of claim 1, wherein the solder contact points are constructed from a member selected from the group consisting of Sn63-Pb37, Sn10-Pb90, Sn5-Pb95, Sn62-Pb36-Ag2, Sn63-Pb34.5-Ag2-Sb0.5, Sn96.5-Ag3.5, Sn—Ag1-Cu0.5, Sn—Ag2.6-Cu0.6, Sn—Ag3-Cu0.5, Sn—Ag3.2-Cu0.5, Sn—Ag3.5-Cu0.75, Sn—Ag3.8-Cu0.7, Sn—Ag4-Cu0.5, Sn—Ag1-Cu0.5-Ni0.05-Ge, Sn—Ag1.2-Cu0.5-Ni0.02-Ge, Sn—Ag3-Cu0.5-Ni0.05-Ge, CASTIN125®, CASTIN258®, CASTIN305®, Sn91-Zn9, Sn—Zn8-Ag0°5-Al0.01-Ga0.1, Sn58-Bi42 and SnAg3.5Cu0.7Bi3Ni0.15Sb1.4.

7. A method of providing fluxing and underfill through the use of one composition, steps of which comprise
   a. providing a semiconductor chip to which is attached one or more solder contact point(s);
   b. dispensing a fluxing underfill composition comprising in a stoichiometric relationship an epoxy resin component of a combination of bisphenol F epoxy resin and a cycloaliphatic epoxy resin and an acidic fluxing component selected from the group consisting of rosin, a dicarboxylic acid and a combination thereof onto at least a portion of the solder contact point(s) to form a coating thereon;
   c. placing onto a circuit board or a carrier substrate the semiconductor chip to which is attached one or more solder contact point(s) having a coating of fluxing underfill composition thereon to establish an electrical interconnection therebetween and to form an assembly; and
   d. exposing the assembly to elevated temperature conditions sufficient to cure the fluxing underfill composition.

8. The method of claim 7, wherein the fluxing underfill composition comprises in a stoichiometric relationship an epoxy resin component of a combination of bisphenol F epoxy resin and a cycloaliphatic epoxy resin and an acidic fluxing component.

9. The method of claim 8, wherein the acidic fluxing component initially acts to provide flux to the one or more solder contact point(s) and then acts to cure the epoxy resin component.

10. A method of fabricating a circuit assembly, comprising the steps of:
    a. dispensing into a container a curable composition comprising in a stoichiometric relationship an epoxy resin component of a combination of bisphenol F epoxy resin and a cycloaliphatic epoxy resin and an acidic fluxing component selected from the group consisting of rosin, a dicarboxylic acid and a combination thereof to serve as a fluxing underfill composition;
    b. adjusting the height of the curable composition within the container;
    c. providing a semiconductor package to which is attached one or more solder contact point(s) and disposing the package in relation to the container such that at least a portion of the solder contact point(s) penetrate the curable composition so as to provide a coating on that portion of the solder contact point(s) that penetrates the curable composition;
    d. placing onto a circuit board or a carrier substrate in a spaced apart relationship the semiconductor package to which is attached one or more solder contact point(s) having a coating of curable composition thereon to define a gap therebetween and create a circuit assembly; and
    e. subjecting the circuit assembly to elevated temperature conditions sufficient to reflow the one or more solder contact point(s) within the gap and to cure the curable composition wherein the one or more solder contact point(s) meet the circuit board or the carrier substrate within the gap; and
    f. optionally, dispensing into the container an additional amount of the curable composition and/or adjusting the height of the curable composition within the container.

* * * * *